US012558678B2

(12) United States Patent
Lacivita et al.

(10) Patent No.: US 12,558,678 B2
(45) Date of Patent: Feb. 24, 2026

(54) DIELECTRIC MATERIAL COMPRISING LEAD COMPOUND AND METHOD OF MAKING THE SAME

(71) Applicant: Samsung Electronics Co., Ltd., Gyeonggi-do (KR)

(72) Inventors: Valentina Lacivita, Cambridge, MA (US); Yan Wang, Brookline, MA (US); Jeong-Ju Cho, Lexington, MA (US)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 727 days.

(21) Appl. No.: 17/589,955

(22) Filed: Feb. 1, 2022

(65) Prior Publication Data

US 2023/0166249 A1     Jun. 1, 2023

Related U.S. Application Data

(60) Provisional application No. 63/284,733, filed on Dec. 1, 2021.

(51) Int. Cl.
B01J 35/00 (2024.01)
B01J 27/135 (2006.01)
(Continued)

(52) U.S. Cl.
CPC ............. B01J 35/39 (2024.01); B01J 27/135 (2013.01); B01J 27/1813 (2013.01);
(Continued)

(58) Field of Classification Search
CPC ..... B01J 35/39; B01J 27/1813; H01G 4/1209; H01G 4/30
See application file for complete search history.

(56) References Cited

U.S. PATENT DOCUMENTS

| | | | |
|---|---|---|---|
| 5,905,049 A | 5/1999 | Matoba | |
| 6,180,420 B1 | 1/2001 | Hintermaier et al. | |

(Continued)

FOREIGN PATENT DOCUMENTS

| | | |
|---|---|---|
| CN | 103545015 A | 1/2014 |
| CN | 109095920 A | 12/2018 |

OTHER PUBLICATIONS

Saga, Tatsuo. "Advances in crystalline silicon solar cell technology for industrial mass production." npg asia materials 2.3 (2010): 96-102. (Year: 2010).*

(Continued)

*Primary Examiner* — Cameron K Miller
(74) *Attorney, Agent, or Firm* — CANTOR COLBURN LLP

(57) ABSTRACT

An electrode assembly including a first electrode and a dielectric layer on the first electrode. The dielectric layer comprises a lead-containing compound of the formula $PbMgV_2O_7$, $Pb_2Te_3O_8$, $PbZnV_2O_7$, $Na_2PbO_2$, $PbP_2O_6$, $PbZnSiO_4$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)(Pb_2O_2)$, $Pb_6Co_9(TeO_6)_5$, $Pb_3(B_3O_7)NO_3$, a lead-containing oxyhalide of the formula $Pb_{13}(Cl_3O_5)_2$, $Pb_{13}(Br_3O_5)_2$, $Pb_2OF_2$, $Pb_2CO_3F_2$, $Pb(AsO_2)_3Cl$, $Pb_3O_2(OH)Cl$, $Pb_6(BO_3)_3OCl$, $Pb_2B_5O_9I$, $Pb_2B_5O_9Br$, $Pb_2B_5O_9Cl$, $Pb_5(AsO_3)_3Cl$, $Pb_8Y_6F_{32}O$, $Pb(O_2Pb_3)_2(BO_3)Br_3$, $Pb_6LaO_7Cl$, a lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3(MoO)_3(PO_4)_5$, $Pb_4O(PO_4)_2$, $RbPb(PO_3)_3$, $PbVO_2PO_4$, $Pb_5(PO_4)_3F$, $Pb_5(PO_4)_3Cl$, $Pb_5(PO_4)_3I$, $PbP_2O_6$, or a combination thereof. The electrode assembly can be particularly useful in various electronic devices.

6 Claims, 2 Drawing Sheets

(51) Int. Cl.

| | |
|---|---|
| *B01J 27/18* | (2006.01) |
| *B01J 35/39* | (2024.01) |
| *H01G 4/12* | (2006.01) |
| *H01G 4/30* | (2006.01) |
| *H01L 29/51* | (2006.01) |
| *H10D 64/68* | (2025.01) |

(52) U.S. Cl.
CPC ............. *H01G 4/1209* (2013.01); *H01G 4/30* (2013.01); *H10D 64/691* (2025.01)

(56) References Cited

U.S. PATENT DOCUMENTS

| | | | | |
|---|---|---|---|---|
| 6,660,057 | B1 * | 12/2003 | Naito | ................. C22C 32/0089 |
| | | | | 75/252 |
| 2006/0163768 | A1 | 7/2006 | Needes et al. | |
| 2016/0260850 | A1 | 9/2016 | Liu et al. | |

OTHER PUBLICATIONS

Wang, Hanying, et al. "Effect of composition of front-electrode-paste glass on electrical performance of multicrystalline silicon solar cells." Journal of Materials Science: Materials in Electronics 28 (2017): 6936-6949. (Year: 2017).*

Taylor, H. E. "The dielectric relaxation spectrum of glass." Transactions of the Faraday Society 52 (1956): 873-881. (Year: 1956).*

Choudhary et al., "Research on some Dialectric Materials," Materials Science and Technologies Series, 2009; 33 pages.

Petousis, I. et al., "Data Descriptor: High-throughput screening of inorganic compounds for the discovery of novel dielectric and optical materials," Scientific Data, Received Mar. 30, 2016; 12 pages.

Takahashi, A. et al., "Machine learning models for predicting the dielectric constants of oxides based on high-throughput first-principles calculations," Physical Review Materials, vol. 4, 2020; 13 pages.

Umeda, Y. et al., "Materials informatics for dielectric materials," Japanese Journal of Applied Physics, vol. 57, 2018; 5 pages.

Yim, K. et al., "Novel high-k dialectics for next-generation electronic devices screened by automated ab initio calculations," NPG Asia Materials, vol. 7, 2015; 6 pages.

* cited by examiner

DIELECTRIC MATERIAL COMPRISING LEAD COMPOUND AND METHOD OF MAKING THE SAME

CROSS-REFERENCE TO RELATED APPLICATION

This application claims priority to U.S. Provisional Patent Application No. 63/284,733, filed on Dec. 1, 2021, in the United States Patent and Trademark Office, and all the benefits accruing therefrom under 35 U.S.C. § 119, the content of which is incorporated herein in its entirety by reference.

BACKGROUND

(1) Field

Disclosed is an electrode assembly including a dielectric layer comprising a lead compound and methods of manufacturing the electrode assembly. Also disclosed is an electronic device comprising the electrode assembly and a capacitor comprising the electrode assembly.

(2) Description of the Related Art

Various electronic devices and electronic components include dielectric materials, including, for example, field effect transistors and capacitors. Currently available dielectric materials face several technical limitations which restrict their application in portable electronics. As the scale of device components such as transistors and capacitors is reduced (e.g., to the nanometer scale), leakage currents impose significant limitations on the reliability of electronic devices.

Accordingly, there remains a continuing need in the art for materials having a combination of large dielectric permittivity and large band gap to enhance capacitance and suppress leakage.

SUMMARY

Disclosed is an electrode assembly comprising a first electrode; and a dielectric layer on the first electrode, wherein the dielectric layer comprises a lead-containing compound of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)$ $[B(AsO_4)_4]$, $PbAl_2Si_2O_8$, $K_4PbO_3$, $Pb_2TiAs_2O_9$, $Pb_4O$ $(VO_4)_2$, $Rb_4PbO_3$, $Pb_2V_2O_7$, $Pb_9Al_8O_{21}$, $Nd(Al_3O_6)$ $(Pb_2O_2)$, $Pb_6Co_9(TeO_6)_5$, $Pb_3(B_3O_7)NO_3$, or a combination thereof.

Also disclosed is an electrode assembly comprising a first electrode; and a dielectric layer on the first electrode, wherein the dielectric layer comprises a lead-containing oxyhalide of the formula $Pb_{13}(Cl_3O_5)_2$, $Pb_{13}(Br_3O_5)_2$, $Pb_2OF_2$, $Pb_2CO_3F_2$, $Pb(AsO_2)_3Cl$, $Pb_3O_2(OH)Cl$, $Pb_6(BO_3)_3OCl$, $Pb_2B_5O_9I$, $Pb_2B_5O_9Br$, $Pb_2B_5O_9Cl$, $Pb_5$ $(AsO_3)_3Cl$, $Pb_8Y_6F_{32}O$, $Pb(O_2Pb_3)_2(BO_3)Br_3$, $Pb_6LaO_7Cl$, $Pb_6LaO_7Br$, or a combination thereof.

Also disclosed is an electrode assembly comprising a first electrode; and a dielectric layer on the first electrode, wherein the dielectric layer comprises a lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3$ $(MoO)_3(PO_4)_5$, $Pb_4O(PO_4)_2$, $RbPb(PO_3)_3$, $PbVO_2PO_4$, $Pb_5$ $(PO_4)_3F$, $Pb_5(PO_4)_3Cl$, $Pb_5(PO_4)_3I$, $PbP_2O_6$, or a combination thereof.

Also disclosed is an electronic device comprising the electrode assembly.

Also disclosed is a capacitor comprising a first electrode, a second electrode, and a dielectric layer disposed between the first and second electrodes, wherein the dielectric layer comprises a lead-containing compound, a lead-containing oxyhalide, or a lead-containing phosphate, wherein the lead-containing compound, lead-containing oxyhalide, and lead-containing phosphate have a bandgap of greater than 1 eV.

Also disclosed is a method of manufacturing a capacitor, the method comprising: providing dielectric material comprising a lead-containing compound, a lead-containing oxyhalide, or a lead-containing phosphate, wherein the lead-containing compound, lead-containing oxyhalide, and lead-containing phosphate have a bandgap of greater than 1 eV; providing a first electrode; disposing a dielectric layer comprising the dielectric material on the first electrode; and disposing a second electrode on the dielectric layer opposite the first electrode.

Also disclosed is a photocatalytic device comprising a substrate; and a photocatalytic layer on the substrate, the photocatalytic layer comprising a lead-containing compound, a lead-containing oxyhalide, or a lead-containing phosphate, wherein the lead-containing compound, lead-containing oxyhalide, and lead-containing phosphate have a bandgap of greater than 1 eV.

Also disclosed is a method of decomposing an organic compound using the photocatalytic device comprising the lead compound.

DETAILED DESCRIPTION

Figure 1:
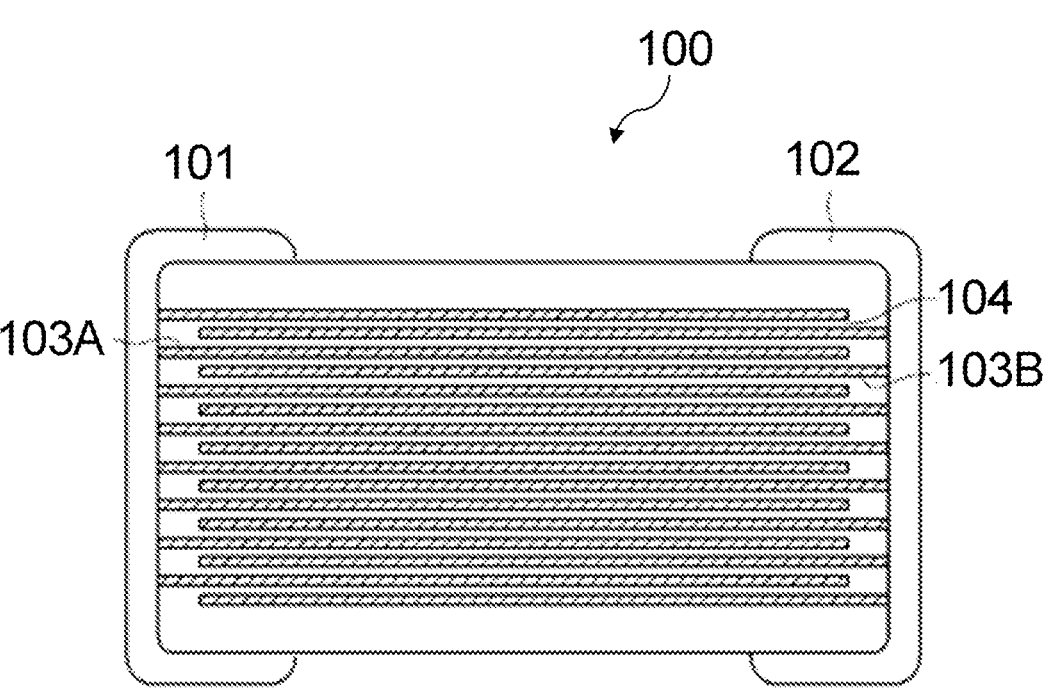
FIG. 1 is a schematic diagram of an embodiment of a multilayer ceramic capacitor (MLCC).

High dielectric permittivity ($\kappa$) inorganic dielectrics are desired for current generation and future electronic circuits. Currently, common inorganic gate dielectrics include metal oxides (MOs)—with M usually belonging to Groups II-IIIA, and III-IV-VB, e.g., $HfO_2$, $Al_2O_3$, $ZrO_2$; nitrides ($Si_3N_4$, AlN); perovskites (($Ba,Sr)TiO_3$), and hybrids thereof. These materials are insulators with relatively large band gap ($E_g$) and have the advantage of being generally air stable and easy to synthesize. However, the dielectric response, $\kappa$, of inorganic materials is inversely proportional to $E_g$, which makes it difficult to adequately satisfy the conditions of simultaneously having both large $\kappa$ and $E_g$. The present inventors have discovered certain lead compounds useful as dielectric materials encompassing different structures and chemistries to address the aforementioned limitations.

Accordingly, disclosed is an electrode assembly comprising a dielectric layer comprising a lead compound. More specifically, an electrode assembly comprises a first electrode and a dielectric layer on the first electrode. The dielectric layer comprises a lead-containing compound of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)(Pb_2O_2)$, $Pb_6Co_9(TeO_6)_5$, $Pb_3(B_3O_7)NO_3$, or a combination thereof; or a lead-containing oxyhalide of the formula $Pb_{13}(Cl_3O_5)_2$, $Pb_{13}(Br_3O_5)_2$, $Pb_2OF_2$, $Pb_2CO_3F_2$, $Pb(AsO_2)_3Cl$, $Pb_3O_2(OH)Cl$, $Pb_2B_5O_9I$, $Pb_6(BO_3)_3OCl$, $Pb_2B_5O_9Br$, $Pb_2B_5O_9Cl$, $Pb_5$ $(AsO_3)_3Cl$, $Pb_8Y_6F_{32}O$, $Pb(O_2Pb_3)_2(BO_3)Br_3$, $Pb_6LaO_7Cl$, $Pb_6LaO_7Br$, or a combination thereof; or a lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3$ $(MoO)_3(PO_4)_5$, $Pb_4O(PO_4)_2$, $RbPb(PO_3)_3$, $PbVO_2PO_4$, $Pb_5$ $(PO_4)_3F$, $Pb_5(PO_4)_3Cl$, $Pb_5(PO_4)_3I$, $PbP_2O_6$, or a combination thereof. A combination comprising at least one of the foregoing lead compounds may be used.

The lead compound (i.e., the aforementioned lead-containing compound, lead-containing oxyhalide, or lead-containing phosphate) has a band gap of greater than 1 electron volt (eV). For example, the lead compound can have a band gap of greater than 1 to 6 eV, or 1.3 to 5.5 eV, or 1.3 to 5.2 eV, or 2 to 5 eV, or 2.2 to 5 eV, or 2.5 to 5 eV. The lead compound can have a dielectric permittivity of greater than 100.

In an aspect, the dielectric layer comprises a lead-containing compound of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)$ $[B(AsO_4)_4]$, $PbAl_2Si_2O_8$, $K_4PbO_3$, $Pb_2TiAs_2O_9$, $Pb_4O$ $(VO_4)_2$, $Rb_4PbO_3$, $Pb_2V_2O_7$, $Pb_9Al_8O_{21}$, $Nd(Al_3O_6)$ $(Pb_2O_2)$, $Pb_6Co_9(TeO_6)_5$, $Pb_3(B_3O_7)NO_3$, or a combination thereof. For example, the lead-containing compound can be a lead-containing oxide of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)$ $(Pb_2O_2)$, $Pb_6Co_9(TeO_6)_5$, or a combination thereof. In an aspect, the lead-containing compound is $PbMgV_2O_7$, $Pb_2Te_3O_8$, $PbZnV_2O_7$, or a combination thereof.

In an aspect, the dielectric layer comprises a lead-containing oxyhalide of the formula $Pb_{13}(Cl_3O_5)_2$, $Pb_{13}$ $(Br_3O_5)_2$, $Pb_2OF_2$, $Pb_2CO_3F_2$, $Pb(AsO_2)_3Cl$, $Pb_3O_2(OH)Cl$, $Pb_2B_5O_9I$, $Pb_6(BO_3)_3OCl$, $Pb_2B_5O_9Br$, $Pb_2B_5O_9Cl$, $Pb_5$ $(AsO_3)_3Cl$, $Pb_8Y_6F_{32}O$, $Pb(O_2Pb_3)_2(BO_3)Br_3$, $Pb_6LaO_7Cl$, $Pb_6LaO_7Br$, or a combination thereof. For example, the lead-containing oxyhalide can be of the formula $Pb_{13}$ $(Cl_3O_5)_2$, $Pb_{13}(Br_3O_5)_2$, or a combination thereof. As used herein, the term lead-containing oxyhalide includes compounds comprising lead, oxygen, and a halogen, such as $Pb_2CO_3F_2$, and does not contain a phosphate group.

In an aspect, the dielectric layer comprises a lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3$ $(MoO)_3(PO_4)_5$, $Pb_4O(PO_4)_2$, $RbPb(PO_3)_3$, $PbVO_2PO_4$, $Pb_5$ $(PO_4)_3F$, $Pb_5(PO_4)_3Cl$, $Pb_5(PO_4)_3I$, $PbP_2O_6$, or a combination thereof. For example, the lead-containing phosphate can be $Pb_2PO_4I$, $Pb_2InP_3O_{11}$, $Pb_2MoP_3O_{11}$, or a combination thereof.

Combinations of any of the aforementioned lead-containing compounds (e.g., the lead-containing oxides), lead-containing oxyhalides, or the lead-containing phosphates are also mentioned.

The lead compound can be present in the dielectric layer in an amount of at least 50 weight percent, or at least 60 weight percent, or at least 70 weight percent, or at least 80 weight percent, or at least 90 weight percent, or at least 95 weight percent, or at least 99 weight percent, each based on the total weight of the dielectric layer. In an aspect the dielectric layer can consist of the lead compound.

The dielectric layer can optionally further comprise one or more additives, for example ceramic additives, a plasticizer, a binder, or a dispersant. A combination thereof may be used.

In an aspect, the dielectric layer can include a binder. A binder can facilitate adherence between components of the dielectric layer, and adherence of the dielectric layer to an electrode. Examples of the binder can include polyacrylic acid (PAA), polyvinylidene fluoride, polyvinyl alcohol, carboxymethyl cellulose (CMC), starch, hydroxypropyl cellulose, regenerated cellulose, polyvinylpyrrolidone, tetrafluoroethylene, polyethylene, polypropylene, ethylene-propylene-diene monomer (EPDM), sulfonated EPDM, styrene-butadiene-rubber, fluorinated rubber, a copolymer thereof, or a combination thereof. The amount of the binder can be in a range of 1 part by weight to 10 parts by weight, for example, in a range of 2 parts by weight to 7 parts by weight, based on a total weight of the dielectric layer. When the amount of the binder is in the range above, e.g., 1 part by weight to 10 parts by weight, the adherence of the dielectric layer to the electrode may be suitably strong.

In an aspect, the dielectric layer can include a plasticizer. A plasticizer is not particularly limited, and can include, for example, diethyl phthalate, dibutyl phthalate, butyl benzyl phthalate, dibenzyl phthalate, alkyl phosphates, polyalkylene glycols, poly(ethylene oxides), hydroxyethylated alkyl phenol, tricresyl phosphate, triethyleneglycol diacetate and polyester plasticizers.

In an aspect, the dielectric layer can include a dispersant. The dispersant, when present, is not particularly limited and can be, for example, a maleic acid based dispersant, a polyethylene glycol based dispersant, an allyl ether copolymer dispersant, or the like, or a combination thereof.

In an aspect, the dielectric layer can include a ceramic additive. Ceramic additives are not particularly limited and can include, for example, oxides, carbonates, hydroxide, oxalates, acetates, or nitrates of one or more of Mg, Ca, Ba, Si, Mn, Co, Sr, Ti, Fe, Y, La, Ce, Pr, Nd, Sm, Eu, Gd, Th, Dy, Ho, Er, Tm, Yb and Lu. Ceramic additives such as $CaTiO_3$, $BaZrO_3$, $SrTiO_3$, $BaSnO_3$, and the like or a combination thereof are mentioned.

The dielectric layer comprising the lead compound is on the first electrode. The first electrode can be a blocking electrode. As used herein, the term "blocking electrode" refers to an electrode material which does not substantially react with the dielectric layer, and does not exhibit substantial ion conductivity, e.g., lithium ion conductivity, or both. For example, the blocking electrode can have an ion conductivity, e.g., lithium ion conductivity, of less than $1\times10^{-7}$ S/cm, e.g., $1\times10^{-7}$ S/cm to $1\times10^{-15}$ S/cm, or $1\times10^{-8}$ S/cm to $1\times10^{-10}$ S/cm.

The first electrode can comprise any suitable electrically conductive metal, for example copper, nickel, silver, gold, zinc, tin, palladium, platinum, lead, molybdenum, iron, an alloy thereof, or a combination thereof. Particularly suitable conductive metals may include copper, a copper alloy (e.g., copper-zirconium, copper-magnesium, copper-zinc, or copper-iron), nickel, or a nickel alloy (e.g., nickel-iron). In an aspect, the first electrode can comprise palladium, nickel, copper, gold, an alloy thereof, or a combination thereof. The first electrode can be provided by any suitable method. Use of sputtering or a plating method is mentioned, the details of which can be determined by one of ordinary skill in the art without undue experimentation.

In an aspect, the electrode assembly can further include a second electrode. The second electrode can be on the dielectric layer, and on a side opposite the first electrode. The second electrode can be a blocking electrode. The second electrode can be the same or different in composition compared to the first electrode, and can comprise any suitable electronically conductive metal, as described above for the first electrode. The second electrode can be provided by any suitable method, for example, sputtering or plating.

The electrode assembly can be manufactured by contacting a lead-containing compound, a lead-containing oxyhalide, or a lead-containing phosphate, or a combination thereof, with a surface of an electrode to form a dielectric layer comprising the lead compound on the electrode to provide an electrode assembly. Contacting the lead compound with the surface of an electrode can comprise forming a layer comprising the dielectric material on the surface of the electrode. In an aspect, a film comprising the lead compound can be provided on a release layer, and the film disposed on the surface of the electrode, and the release layer can be removed. In an aspect, the contacting can comprise forming a slurry of the lead compound in a suitable solvent, and forming the dielectric layer, for example by a doctor blade method, or the like, and the applied slurry can be dried. The dried lead-containing layer can be contacted with the surface of an electrode.

The dielectric layer of the electrode assembly can optionally further comprise a dielectric material different from the lead compound. For example, the dielectric layer can optionally further comprise a dielectric filler comprising titanium dioxide (rutile or anatase), barium titanate, strontium titanate, silica (including fused amorphous silica), corundum, wollastonite, $Ba_2Ti_9O_{20}$, solid glass spheres, synthetic glass or ceramic hollow spheres, quartz, boron nitride, aluminum nitride, silicon carbide, beryllia, alumina, alumina trihydrate, magnesia, mica, talcs, nanoclays, magnesium hydroxide, or a combination comprising at least one of the foregoing. In an aspect, the dielectric layer can optionally further comprise a dielectric filler comprising a metal oxide, wherein the metal is of Groups II-IIIA, and III-IV-VB, e.g., $HfO_2$, $Al_2O_3$, $ZrO_2$; nitrides ($Si_3N_4$, AlN); perovskites ((Ba, Sr)$TiO_3$), and hybrids thereof. A single secondary dielectric filler, or a combination of secondary dielectric fillers, can be used to provide a desired balance of properties. The dielectric filler, when present, can be included in the dielectric layer in an amount of 1 to 60 vol %, or 10 to 50 vol %, based on the total volume of the dielectric layer.

An electronic device comprising the electrode assembly represents another aspect of the present disclosure. Electronic devices comprising the bismuth compounds of the present disclosure can be used in a variety of electronics application, such as personal computers, cell phones, digital cameras, and other electronic equipment, as examples. Electronic devices can be fabricated by sequentially depositing insulating (or dielectric) layers, conductive layers, and semiconductive layers of a material over a semiconductor substrate, and patterning the various layers using lithography to form circuit components and elements thereon. In an aspect, the electronic device comprises the electrode assembly and a second electrode opposite the first electrode.

If desired, the electronic device may also include other layers as is known in the art. For example, a protective coating may optionally be formed between the dielectric material and one or both of the first and second electrodes. The protective coating may be provided by sputtering, chemical vapor deposition, or atomic layer deposition, for example. The details of such additional layers, including their composition and deposition, can be determined by one of skill in the art without undue experimentation.

The electronic device can be provided with outer electrodes which may serve as external terminals. For example, the electronic device may contain a first outer electrode to which the first electrode of the electronic device is electrically connected and a second outer electrode to which the second electrode of the electronic device is electrically connected. Any suitable conductive material may be employed to form the outer electrodes, such as a conductive metal, e.g., copper, nickel, silver, zinc, tin, palladium, lead, aluminum, molybdenum, titanium, iron, zirconium, magnesium, an alloy thereof, or a combination thereof. Particularly suitable conductive metals may include copper, a copper alloy, e.g., copper-zirconium, copper-magnesium, copper-zinc, or copper-iron, nickel, a nickel alloy, e.g., nickel-iron. The thickness of the outer electrodes may be selected to minimize the thickness of the electronic device. For instance, the thickness of the outer electrodes may range from 0.05 to 1 millimeter, or 0.05 to 0.5 millimeters, or 0.07 to 0.2 millimeters. Optionally, the surface of the outer electrodes may be electroplated with nickel, silver, gold, or tin to provide suitable contacts with suitable stability and resistance to oxidation, for example. The details of the electroplating, including its composition and method of deposition, may be determined by one of skill in the art without undue experimentation.

The electronic device may be manufactured by providing the first electrode, providing the second electrode, and disposing the dielectric material between the first electrode and the second electrode. In an aspect disposing the dielectric material between the first electrode and the second electrode can comprise forming a layer comprising the dielectric material on one of the first electrode and the second electrode. In an aspect, a film comprising the lead compound can be provided on a release layer, and the film disposed on at least one of the first electrode and the second electrode. The release layer can be removed, and then the first electrode can be disposed on the second electrode to manufacture the electronic device.

In an aspect, the lead compound can be combined with a suitable solvent to provide a slurry. The slurry can be applied to a carrier film, for example by a doctor blade method, or the like, and the applied slurry can be dried. The first and second inner electrodes may be formed on a surface of the dielectric layer. Forming the first and second inner electrodes can be by, for example, disposing a conductive paste comprising the conductive metal on a surface of the dielectric layer. The first and second inner electrodes can be formed at a predetermined thickness.

In an aspect, the electronic device can be, for example, a capacitor, a field effect transistor, or the like. A capacitor therefore represents another aspect of the present disclosure. In an aspect, the capacitor can be a ceramic capacitor. In an aspect, the capacitor can be a multilayer ceramic capacitor (MLCC). The multilayer ceramic capacitor comprises a ceramic body in which a plurality of dielectric layers are stacked. The multilayer ceramic capacitor includes first and second blocking inner electrodes which are opposite in polarity and are interspersed with the dielectric material layers comprising the lead compound. The first and second blocking inner electrodes are disposed to face each other along a direction of lamination of the dielectric layers and are electrically insulated from each other by the dielectric layers. Ends of the first and second blocking inner electrodes are alternately and respectively exposed to both ends of the ceramic capacitor body. The ends of the first and second blocking inner electrodes exposed to the ends of the ceramic capacitor body are electrically connected to the first and second blocking outer electrodes, respectively.

A schematic diagram of a multilayer ceramic capacitor (MLCC) is provided in FIG. 1. As shown in the multilayer ceramic capacitor 100 of FIG. 1, a first blocking external electrode 101 can be used in combination with a second blocking external electrode 102. In the MLCC 100 shown in FIG. 1, first and second internal blocking electrodes 103A and 103B are formed which are connected and extend from the first and second blocking external electrodes 101 and 102, respectively. The first internal blocking electrode 103A extends from a surface of the first electrode 101, as shown in FIG. 1, and the second internal blocking electrode 103B extends from the opposite surface of the second blocking external electrode 102. As shown, the internal electrodes are alternately disposed in an interdigitated fashion with the dielectric material 104 between the internal electrodes 103A and 103B. In an embodiment, the MLCC 100 may include a coating layer (not shown) disposed on at least one outer surface of the MLCC 100. When present, the coating can be a plating layer and can comprise, for example, nickel, copper, and the like or a combination thereof. Optionally, a second plating layer can be disposed on the first plating layer, wherein the second plating layer can comprise, for example, solder, tin, and the like, or a combination thereof.

When the electronic device is a multilayer ceramic capacitor, the multilayer ceramic capacitor can be manufactured by forming a first internal electrode on a first dielectric layer comprising the lead compound. A second internal electrode can be formed on a second dielectric layer comprising the lead compound. The method further comprises forming a ceramic body by alternately stacking a plurality of first and second dielectric layers having the first and second internal electrodes formed thereon and sintering the stacked sheets. First and second external electrodes can be formed on opposite sides of the ceramic body so as to be electrically connected to the plurality of the first and second internal electrodes to provide a multilayer ceramic capacitor.

In an aspect the lead compound disclosed herein can be particularly useful in transistors, for example as a gate dielectric layer in a transistor. The transistors can generally be of any shape or form, e.g., planar transistors, FinFET transistors, nanowire devices, or the like. The transistors can be, for example, NMOS (N-type field effect transistors, NFET) or PMOS (p-type field effect transistors, PFET) type devices wherein the "N" and "P" designation is based upon the type of dopants used to create the source/drain regions of the devices. CMOS (Complementary Metal Oxide Semiconductor)-type transistors can be manufactured using both NMOS and PMOS transistor devices. Irrespective of the physical configuration of the transistor device, a transistor includes drain and source regions and a gate electrode structure positioned above or around a channel region and between the source/drain regions. Upon application of an appropriate control voltage to the gate electrode, a conductive channel region forms between the drain region and the source region.

Accordingly, the electrode assembly of the present disclosure can be a gate electrode assembly for a transistor, wherein the first electrode is a gate electrode and the dielectric layer comprising the lead compound is a gate dielectric layer on the gate electrode. A transistor can comprise the gate electrode assembly. In an aspect, an electronic device can comprise one or more transistors comprising the gate electrode assembly comprising the lead compound.

In an aspect, a transistor device can comprise a gate electrode disposed on or embedded in a substrate, for example an insulating substrate. The gate electrode can be formed of a metal which can be deposited. Various metals are generally known for use as a gate electrode. Exemplary metals for a gate electrode can include, but are not limited to, gold (Au), aluminum (Al), titanium (Ti), palladium (Pd), poly-silicon (poly-Si), and the like, or a combination thereof. Deposition techniques for forming the gate electrode can include, for example, sputtering or electron beam evaporation. In an aspect, the gate electrode can be formed by depositing the metal over the substrate and then etching (e.g., by photolithography) to pattern the metal into the gate electrode.

The gate electrode can be formed on a gate dielectric layer, where the gate dielectric layer comprises the lead compound of the present disclosure. In an aspect, the gate electrode can be selectively deposited or otherwise grown on the gate dielectric layer using a chemical reactive deposition process. In an aspect, a dielectric deposition-prohibiting layer can be used to prevent deposition of the dielectric material in certain areas of the insulating substrate. When present, a dielectric deposition-prohibiting layer can comprise, for example, graphene, a molecular self-assembled monolayer (SAM), or a hydrophobic monolayer (e.g., hexamethyldisilazane, HMDS), or any other suitable material that can prevent chemical reactive deposition of dielectric material on the regions of the insulating substrate layer surrounding the gate electrode. In an aspect, the gate dielectric layer can be deposited and subsequently etched (e.g., by photolithography) to remove the dielectric material from certain areas of the substrate. The gate dielectric material for use in a transistor can be provided, for example, by various deposition techniques including physical vapor deposition (PVD), chemical vapor deposition (CVD), plasma enhanced CVD, atomic layer deposition (ALD), evaporation, chemical solution deposition, and the like to provide a gate dielectric comprising one or more of the lead compounds of the present disclosure. In an aspect, following deposition of the gate dielectric layer, further processing such as chemical mechanical polishing can be performed.

The transistor further comprises a source region and a drain region formed on opposite sides of the gate electrode.

Figure 2:
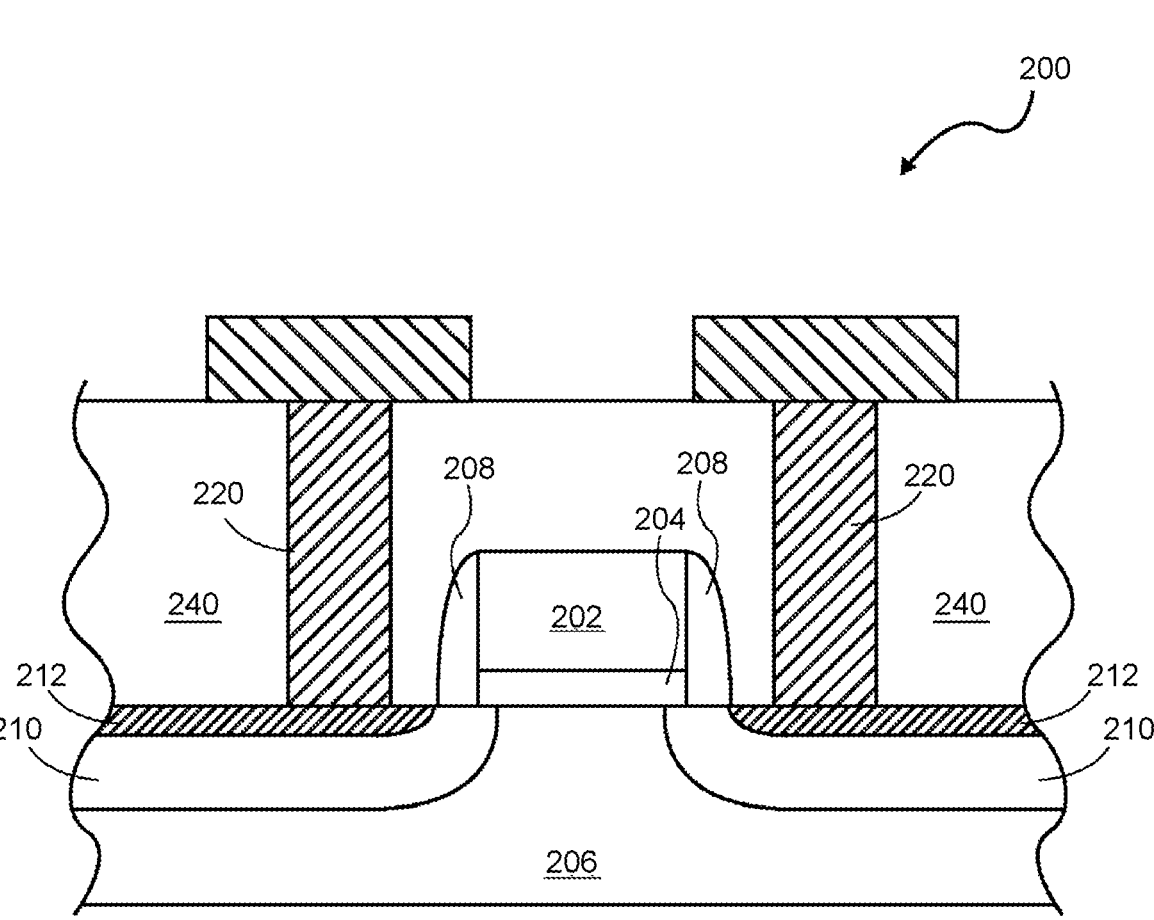
FIG. 2 is a schematic diagram of an embodiment of a transistor.

A schematic diagram of an exemplary transistor is provided in FIG. 2. As shown in the transistor 200 of FIG. 2, a gate electrode 202 is formed on a gate dielectric layer 204 which in turn is on a substrate 206. A pair of sidewall spacers 208 are formed along opposite sides of the gate electrode 202. A pair of source/drain regions 210 are formed along opposite sides of the gate electrode 202. In an aspect, a silicide layer 212, such as titanium silicide or nickel silicide, is used to couple contacts 220 formed in an interlayer dielectric 240 to the source and drain regions 210. The interlayer dielectric can comprise, for example, a silicon dioxide film or a low k dielectric, such as a fluorine doped silicon dioxide (SiOF), a carbon doped oxide (CDO) or a zeolite dielectric and can isolate the transistor 200 from the various components that may be connected, for example to form a circuit. Silicide regions 212 can be formed by alloying a metal such as titanium, nickel or cobalt with a silicon substrate 206 to form the metal silicide. Contacts 220 can be formed from a relatively high resistance film such as tungsten which can be conformally deposited so that it fills contact opening formed in the dielectric layer 240.

The lead compounds disclosed herein can also be useful for various applications involving photocatalysis, for example for photocatalytic purification of water and gases, oxidation of alcohols, water splitting, oxygen and hydrogen evolution, disinfection, nitrogen fixation, and organic synthesis.

Accordingly, a photocatalytic device represents another aspect of the present disclosure. A photocatalytic device comprises a photocatalytic layer comprising a lead-containing compound of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)$ $[B(AsO_4)_4]$, $PbAl_2Si_2O_8$, $K_4PbO_3$, $Pb_2TiAs_2O_9$, $Pb_4O$

9

$(VO_4)_2$, $Rb_4PbO_3$, $Pb_2V_2O_7$, $Pb_9Al_8O_{21}$, $Nd(Al_3O_6)$ $(Pb_2O_2)$, $Pb_6Co_9(TeO_6)_5$, $Pb_3(B_3O_7)NO_3$, or a combination thereof; or a lead-containing oxyhalide of the formula $Pb_{13}$ $(Cl_3O_5)_2$, $Pb_{13}(Br_3O_5)_2$, $Pb_2OF_2$, $Pb_2CO_3F_2$, $Pb(AsO_2)_3Cl$, $Pb_3O_2(OH)Cl$, $Pb_2B_5O_9I$, $Pb_6(BO_3)_3OCl$, $Pb_2B_5O_9Br$, $Pb_2B_5O_9Cl$, $Pb_5(AsO_4)_3Cl$, $Pb_8Y_6F_{32}O$, $Pb(O_2Pb_3)_2(BO_3)$ $Br_3$, $Pb_6LaO_7Cl$, $Pb_6LaO_7Br$, or a combination thereof; or a lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3(MoO)_3(PO_4)_5$, $Pb_4O(PO_4)_2$, $RbPb(PO_3)_3$, $PbVO_2PO_4$, $Pb_5(PO_4)_3F$, $Pb_5(PO_4)_3Cl$, $Pb_5(PO_4)_3I$, $PbP_2O_6$, or a combination thereof. The photocatalytic layer can be disposed on a substrate. The substrate can be any suitable material including a ceramic, metal, or polymeric material. In an aspect, the substrate can be glass. In an aspect the substrate is transparent or translucent.

The photocatalytic layer can optionally further comprise one or more additives, for example ceramic additives, a plasticizer, a binder, or a dispersant. Examples of such additives are described above in reference to the dielectric layer.

The photocatalytic device can further include a UV or visible light source such as a xenon arc lamp, a halogen lamp, or lasers. Solar irradiation can also be effective.

In an aspect, the photocatalytic device comprising the lead compound can be used to decompose organic compounds. For example, a medium (e.g., a liquid or a gas) that includes the organic material can be exposed to the photocatalytic device comprising the lead compound and to light at a wavelength effective to activate the lead compound (e.g., to visible light, for example at a wavelength of 380 to 750 nm). The medium can be, for example, an aqueous solution, an aqueous suspension, or an aqueous dispersion.

The lead-containing compounds of the present disclosure can also be useful in optical applications. For example, a dielectric waveguide can comprise a dielectric material comprising the lead-containing compound of the formula $PbMgV_2O_7$, $Pb_2Te_3O_8$, $PbZnV_2O_7$, $Na_2PbO_2$, $PbZnSiO_4$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)(Pb_2O_2)$, $Pb_6Co_9(TeO_6)_5$, $Pb_3(B_3O_7)NO_3$, or a combination thereof; the lead-containing oxyhalide of the formula $Pb_{13}(Cl_3O_5)_2$, $Pb_{13}(Br_3O_5)_2$, $Pb_2OF_2$, $Pb_2CO_3F_2$, $Pb(AsO_2)_3Cl$, $Pb_3O_2(OH)Cl$, $Pb_6(BO_3)_3OCl$, $Pb_2B_5O_9I$, $Pb_2B_5O_9Br$, $Pb_2B_5O_9Cl$, $Pb_5(AsO_3)_3Cl$, $Pb_8Y_6F_{32}O$, $Pb(O_2Pb_3)_2(BO_3)Br_3$, $Pb_6LaO_7Cl$, $Pb_6LaO_7Br$, or a combination thereof; or the lead-containing phosphate of the formula $Pb_2PO_4I$, $Pb_2InP_3O_{11}$, $Pb_2MoP_3O_{11}$, $Pb_2Ni(PO_4)_2$, $Pb_2VO(PO_4)$, $K_2Pb(PO_3)_4$, $Pb_3(MoO)_3(PO_4)_5$, $Pb_4O(PO_4)_2$, $RbPb(PO_3)_3$, $PbVO_2PO_4$, $Pb_5(PO_4)_3F$, $Pb_5(PO_4)_3Cl$, $Pb_5(PO_4)_3I$, $PbP_2O_6$. An exemplary dielectric waveguide is an optical fiber. A dielectric waveguide can comprise one or more dielectric layers comprising the foregoing lead-containing compounds.

This disclosure is further illustrated by the following examples, which are non-limiting.

EXAMPLES

The bandgap of various lead-containing compounds was determined using the density-functional theory generalized gradient approximation (DFT-GGA) method. The lead compounds and their bandgaps are shown in Table 1.

10

TABLE 1

| Sample | Chemical Formula | $E_g$ (eV) |
|---|---|---|
| 1 | $Pb_{13}(Cl_3O_5)_2$ | 1.896 |
| 2 | $PbMgV_2O_7$ | 2.510 |
| 3 | $Pb_{13}(Br_3O_5)_2$ | 2.007 |
| 4 | $Pb_2PO_4I$ | 2.931 |
| 5 | $Pb_2InP_3O_{11}$ | 4.041 |
| 6 | $Pb_2MoP_3O_{11}$ | 3.503 |
| 7 | $Pb_2Te_3O_8$ | 3.000 |
| 8 | $PbZnV_2O_7$ | 2.407 |
| 9 | $Na_2PbO_2$ | 2.408 |
| 10 | $PbP_2O_6$ | 4.480 |
| 11 | $Pb_2Ni(PO_4)_2$ | 3.682 |
| 12 | $Pb_2VO(PO_4)$ | 2.279 |
| 13 | $Pb_2OF_2$ | 2.860 |
| 14 | $Pb_2CO_3F_2$ | 3.479 |
| 15 | $Pb(AsO_2)_3Cl$ | 3.393 |
| 16 | $Pb_5(PO_4)_3I$ | 2.425 |
| 17 | $PbZnSiO_4$ | 3.103 |
| 18 | $K_2Pb(PO_3)_4$ | 5.103 |
| 19 | $Pb_3O_2(OH)Cl$ | 2.142 |
| 20 | $Pb_3(MoO)_3(PO_4)_5$ | 2.527 |
| 21 | $Pb_2In_2Si_2O_9$ | 3.350 |
| 22 | $Pb_2B_5O_9I$ | 3.311 |
| 23 | $Pb_6(AsO_4)[B(AsO_4)_4]$ | 3.153 |
| 24 | $PbAl_2Si_2O_8$ | 4.268 |
| 25 | $Pb_5(PO_4)_3F$ | 3.722 |
| 26 | $Pb_5(PO_4)_3Cl$ | 3.411 |
| 27 | $Pb_6(BO_3)_3OCl$ | 2.816 |
| 28 | $Pb_2B_5O_9Br$ | 3.407 |
| 29 | $Pb_2B_5O_9Cl$ | 3.489 |
| 30 | $Pb_5(AsO_3)_3Cl$ | 2.668 |
| 31 | $Pb_8Y_6F_{32}O$ | 4.079 |
| 32 | $K_4PbO_3$ | 2.279 |
| 33 | $Pb_4O(PO_4)_2$ | 3.199 |
| 34 | $RbPb(PO_3)_3$ | 4.565 |
| 35 | $PbVO_2PO_4$ | 2.322 |
| 36 | $Pb_2TiAs_2O_9$ | 2.622 |
| 37 | $Pb_4O(VO_4)_2$ | 2.860 |
| 38 | $Rb_4PbO_3$ | 2.172 |
| 39 | $Pb_2V_2O_7$ | 2.868 |
| 40 | $Pb_9Al_8O_{21}$ | 2.875 |
| 41 | $Nd(Al_3O_6)(Pb_2O_2)$ | 2.986 |
| 42 | $Pb_6Co_9(TeO_6)_5$ | 1.360 |
| 43 | $Pb(O_2Pb_3)_2(BO_3)Br_3$ | 1.925 |
| 44 | $Pb_6LaO_7Cl$ | 2.142 |
| 45 | $Pb_3(B_3O_7)NO_3$ | 3.013 |
| 46 | $Pb_6LaO_7Br$ | 1.973 |

Example 1

Neodymium oxide, aluminum oxide, and lead oxide will be ground and then heat-treated in air in the presence of excess $PbF_2$ to form $Nd(Al_3O_6)(Pb_2O_2)$. The $Nd(Al_3O_6)$ $(Pb_2O_2)$ will be pressed on to a nickel substrate to form a sputtering target. A Ni foil will then be sputtered with $Nd(Al_3O_6)(Pb_2O_2)$ from the sputtering target to form a layer of $Nd(Al_3O_6)(Pb_2O_2)$ on the metal foil to form an electrode assembly.

Example 2

Lead oxide, lead chloride, and lanthanum nitrate will be ground and then heat-treated in air to form $Pb_6LaO_7Cl$. The $Pb_6LaO_7Cl$ will be pressed on to a nickel substrate to form a sputtering target. A Ni foil will then be sputtered with $Pb_6LaO_7Cl$ from the sputtering target to form a layer of $Pb_6LaO_7Cl$ on the metal foil to form an electrode assembly.

Example 3

Indium oxide, lead chloride, and ammonium dihydrogen phosphate will be ground and then heat-treated in air to form $Pb_2InP_3O_{11}$. The $Pb_2InP_3O_{11}$ will be pressed on to a nickel substrate to form a sputtering target. A Ni foil will then be sputtered with $Pb_2InP_3O_{11}$ from the sputtering target to form a layer of $Pb_2InP_3O_{11}$ on the metal foil to form an electrode assembly.

Various aspects are shown in the accompanying drawings. This invention may, however, be embodied in many different forms, and should not be construed as limited to the aspects set forth herein. Rather, these aspects are provided so that this disclosure will be thorough and complete, and will fully convey the scope of the invention to those skilled in the art. Like reference numerals refer to like elements throughout.

It will be understood that when an element is referred to as being "on" another element, it can be directly on the other element or intervening elements may be present therebetween. In contrast, when an element is referred to as being "directly on" another element, there are no intervening elements present.

It will be understood that, although the terms "first," "second," "third," etc. may be used herein to describe various elements, components, regions, layers, or sections, these elements, components, regions, layers, or sections should not be limited by these terms. These terms are only used to distinguish one element, component, region, layer, or section from another element, component, region, layer or section. Thus, "a first element," "component," "region," "layer," or "section" discussed below could be termed a second element, component, region, layer or section without departing from the teachings herein.

The terminology used herein is for the purpose of describing particular aspects only and is not intended to be limiting. As used herein, the singular forms "a," "an," and "the" are intended to include the plural forms, including "at least one," unless the content clearly indicates otherwise. "At least one" is not to be construed as limiting "a" or "an." "Or" means "and/or." It will be further understood that the terms "comprises" and/or "comprising," or "includes" or "including" when used in this specification, specify the presence of stated features, regions, integers, steps, operations, elements, or components, but do not preclude the presence or addition of one or more other features, regions, integers, steps, operations, elements, components, or groups thereof.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary aspects are described herein with reference to cross section illustrations that are schematic illustrations of idealized aspects. As such, variations from the shapes of the illustrations as a result, for example, of manufacturing techniques and/or tolerances, are to be expected. Thus, aspects described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

"Oxidation state" as used herein is a formalism used to describe a hypothetical charge that an atom would have if all bonds to atoms of different elements were 100% ionic, with no covalent component.

"Group" means a group of the Periodic Table of the Elements according to the International Union of Pure and Applied Chemistry ("IUPAC") Group 1-18 group classification system.

While a particular aspect has been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

What is claimed is:

1. An electrode assembly comprising a first electrode; and a dielectric layer on the first electrode, wherein the dielectric layer comprises a lead-containing compound of the formula $PbMgV_2O_7$, $PbV_2O_7$, $Na_2PbO_2$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)(Pb_2O_2)$, $Pb_6Co_9$ $(TeO_6)_5$, $Pb_3(B_3O_7)NO_3$, or a combination thereof.

2. The electrode assembly of claim 1, wherein the lead-containing compound has a bandgap of greater than 1 eV.

3. The electrode assembly of claim 1, wherein the lead-containing oxide has a dielectric permittivity of greater than 100.

4. The electrode assembly of claim 1, wherein the lead-containing compound is a lead-containing oxide of the formula $PbMgV_2O_7$, $PbZnV_2O_7$, $Na_2PbO_2$, $Pb_2In_2Si_2O_9$, $Pb_6(AsO_4)[B(AsO_4)_4]$, $PbAl_2Si_2O_8$, $K_4PbO_3$, $Pb_2TiAs_2O_9$, $Pb_4O(VO_4)_2$, $Rb_4PbO_3$, $Pb_2V_2O_7$, $Pb_9Al_8O_{21}$, $Nd(Al_3O_6)$ $(Pb_2O_2)$, $Pb_6Co_9(TeO_6)_5$, or a combination thereof.

5. The electrode assembly of claim 1, wherein the lead-containing compound is $PbMgV_2O_7$, $PbZnV_2O_7$, or a combination thereof.

6. An electronic device comprising the electrode assembly of claim 1, and a second electrode opposite the first electrode.

\* \* \* \* \*